AUTOMATIC COIL ADJUSTING SYSTEM

Filed March 27, 1951

Inventor
Thomas A. Prewitt
By Willits, Helwig & Baillio
Attorneys

United States Patent Office 2,766,384

Patented Oct. 9, 1956

2,766,384

AUTOMATIC COIL ADJUSTING SYSTEM

Thomas A. Prewitt, Kokomo, Ind., assignor to General Motors Corporation, Detroit, Mich., a corporation of Delaware Application March 27, 1951, Serial No. 217,804

7 Claims. (Cl. 250—40)

This invention relates to electrical apparatus of a type suited for adjusting the electrical constants of tunable circuits to a predetermined frequency, and, more particularly, to apparatus for automatically aligning the tuning of high frequency radio transformers or similar devices to a predetermined resonance condition.

It is desirable in the construction of a radio receiver, for example, that certain components thereof be electrically resonant at a predetermined frequency. This is particularly true in the case of intermediate frequency amplifier coupling transformers which serve to transfer a maximum amount of power at the intermediate frequency from the first to the second detector stage in a superheterodyne receiver. These components, therefore, are constructed so as to be tunable over a narrow frequency range to permit alignment thereof to a predetermined frequency, the tuning being effected by varying an adjustable capacitor or inductance forming a part of a tunable circuit.

In accordance with the invention such adjustments are rapidly and automatically performed by means including a phase sensitive translating device the mechanical displacement of which is controlled by a phase comparison control circuit which includes the electrical circuit to be adjusted.

Accordingly, it is an object of this invention to provide means for automatically adjusting the tuning of an electrical circuit to a predetermined frequency.

Another object is to provide means for rapidly and automatically aligning intermediate frequency transformers to a predetermined resonance condition.

The invention may be applied also to the alignment or adjustment of other radio and electrical components such as radio tuners, various types of adjustable coupling coils and condensers and, in brief, to the adjustment of all such devices which produce or may be made to produce changes in the tuning of a resonant circuit as a function of the properties or position of the device, whereby similar devices manufactured in large quantity may be adjusted to have the same electrical characteristics.

It is, therefore, a further object of this invention to provide means for rapidly and automatically adjusting a number of similar electrical devices to have the same electrical characteristics.

In accordance with the preferred embodiment of the principle of the invention, the resonance condition of a tunable circuit is determined by the direction and magnitude of the phase shift imparted thereby to impressed signal oscillations of the frequency to which the circuit is to be tuned, a zero phase shift or null condition obtaining when the circuit is tuned to the desired frequency. A reversible electric motor, responsive to the direction and magnitude of the phase displacement imparted to the signal oscillations applied to the tunable circuit, is employed to automatically adjust the circuit being aligned in such manner as to substantially eliminate the phase displacement imparted to the signal oscillations, whereby the circuit will be substantially tuned to the desired frequency.

The nature of the present invention and other objects, features and advantages thereof will be apparent from a consideration of the following detailed description and drawings, in which.

Figure 1:
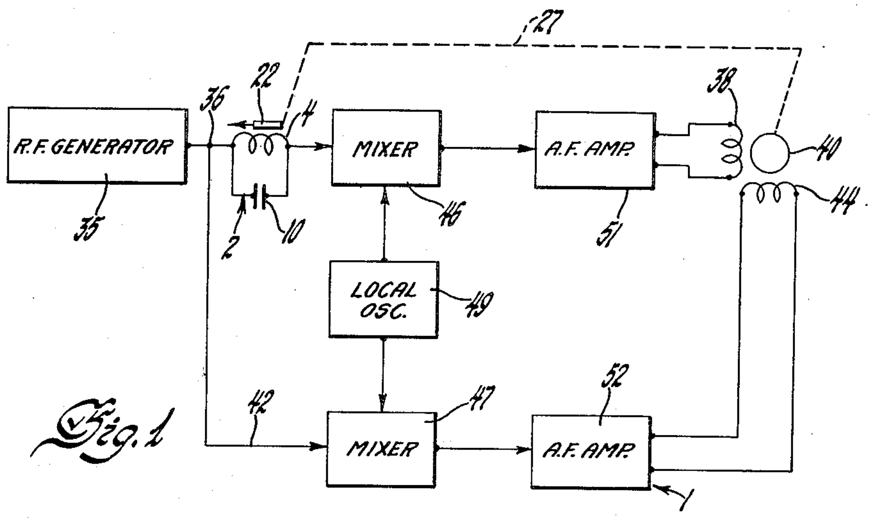
Fig. 1 is a block diagrammatic showing of apparatus in accordance with the invention for aligning the tuning of intermediate frequency transformers to a predetermined resonance condition.

Referring to the drawings, Fig. 1 illustrates apparatus in accordance with the invention for automatically aligning the tuning of an intermediate frequency transformer unit 2 to a predetermined resonance condition. Before proceeding with a detailed description of Fig. 1 it may aid in understanding the invention to describe generally the construction of a transformer of the type which the apparatus of Fig. 1 may be used to align.

Figure 2:
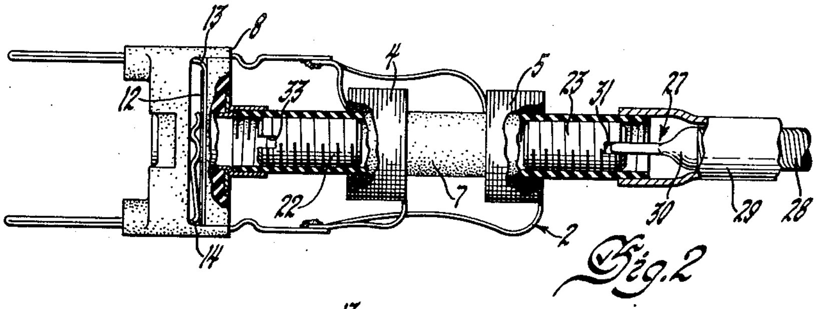
Fig. 2 is a side elevation of an intermediate frequency transformer showing means for aligning the tuning thereof.

Fig. 2 illustrates the construction of an intermediate frequency transformer assembly 2 together with means for adjusting the tuning of one coil unit thereof. The transformer is formed of two inductively coupled coils 4, 5, each having a condenser connected thereacross so as to provide a pair of magnetically-coupled, capacity-inductance resonant circuits. The coils are wound on a common tubular form 7 of insulating material which is rigidly mounted on an insulator base 8, the latter enclosing a pair of fixed trimmer condensers formed by spaced plates. The trimmer condenser associated with, say, the left hand coil 4 is formed by plates 13, 14, separated by a dielectric 12. The other condenser (not shown) is associated with the right hand coil 5 and is formed by a second pair of spaced plates similar to 13, 14, but located to the rear thereof. The tuning of each coil unit of the transformer is accomplished by adjusting the position of a threaded comminuted ferro-magnetic core or slug 22, 23 with respect to its surrounding coil, whereby the inductance of each coil may be changed to the desired value.

The means 27 for adjusting the transformer unit shown in Fig. 2 comprises a motor-driven screw-driver which includes a flexible shaft 28 within a hollow cable 29, one end of the cable being adapted to fit over the end portion of tube 7. A nib or screw-driver tip 30 formed of non-magnetic material at the end of the shaft 28 is inserted into the transformer to engage a slot 31 in the slug 23 in the interior of tube 7.

Figures 3, 4:
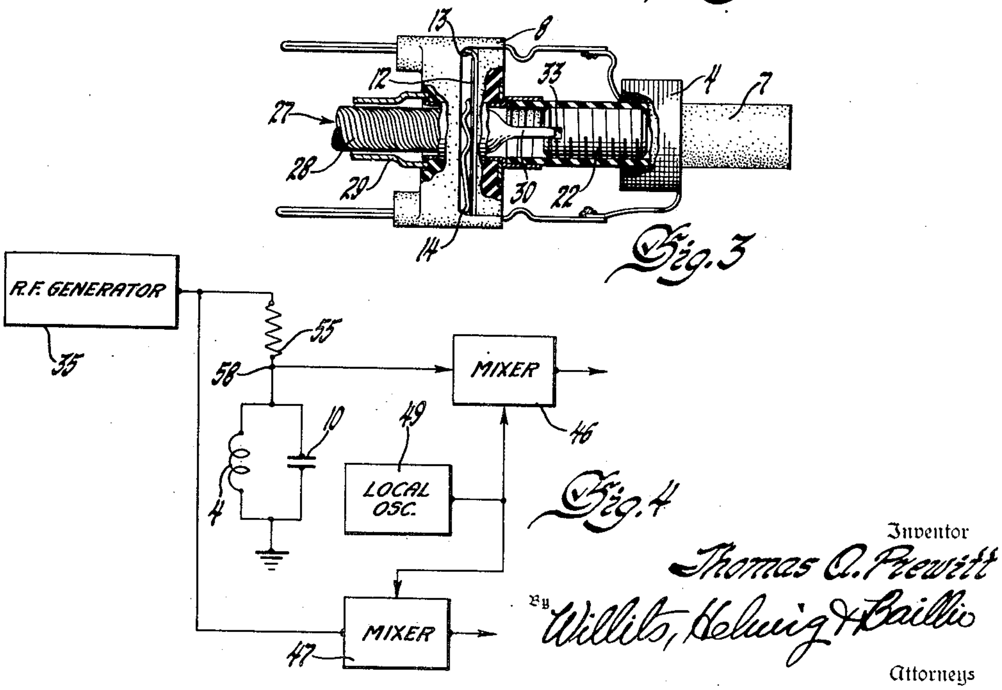
Fig. 3 is a side elevation of a tunable coupling unit showing means for aligning the tuning thereof.
Fig. 4 is a modification of Fig. 1.

Fig. 3 illustrates a high frequency coupling unit, the construction of which is similar to that of the transformer of Fig. 2 and may, for example, represent the left-hand portion of Fig. 2. The means for adjusting the coil unit thereof is substantially similar to that shown in connection with Fig. 2 and is inserted from the left end of the assembly to engage slot 33 in slug 22.

Returning now to Fig. 1, the apparatus 1 shown therein comprises a first source of oscillations 35, a first circuit or test signal path 36 connected from the source 35 to one winding 38 of a phase sensitive translating device such as a motor 40 and including in series therewith one coil unit 4, 10 of the transformer being aligned, and a second circuit or reference signal path 42 connected in parallel with path 36 from oscillator 35 to a second winding 44 of motor 40.

For purpose of setting forth a complete disclosure it will be assumed by way of example that the frequency at which transformer coil unit 4, 10 is to be aligned is 260 kilocycles and that the signal oscillations generated by oscillator 35 correspond to this frequency. The oscillation source 35 may be an R. F. generator such, for example, as a Pierce-type crystal oscillator which generates oscillations of substantially constant frequency and amplitude. Motor 40 may be a two phase servo unit operating on 400 cycle alternating current energy applied to its respective windings, one of which is a control winding 38 and the other a reference winding 44.

To complete the description of Fig. 1 the invention as exemplified herein further includes frequency converting or heterodyning means in each of the parallel circuit paths. The heterodyning means comprise a pair of identical mixer units 46, 47 and a second or local oscillator 49 connected therebetween. The mixer units are followed by a pair of identical low frequency audio power amplifiers 51, 52 which are connected in each of the circuit paths to supply amplified output energy to the respective windings 38, 44 of 40.

The mixer units 46, 47 are also of conventional design, and may be, for example, of the type employing a duo-triode vacuum tube wherein the signals to be heterodyned are impressed upon respective grids, the modulation products including the principal sum and difference frequency components appearing in the common plate circuit thereof. Local oscillator 49 may be of similar design to the R. F. generator 35, but generates oscillations differing in frequency therefrom by the operating frequency of motor 40, i. e. 260 plus or minus 0.4 kilocycles. Audio amplifiers 51, 52 may each comprise a phase inverter stage connected to energize a push-pull power amplifier, and, like the aforementioned components, may be of a type well known in the art.

The adjusting means shown diagrammatically in Fig. 1 by the dotted line 27, whereby the adjustable element of the tunable circuit being aligned is varied, comprises, as mentioned hereinabove in connection with Fig. 2, a flexible shaft 28 enclosed in a cable 29. One end of the shaft is connected to the shaft of the motor 40 through suitable reduction gearing (not shown) and has a screwdriver tip or nib at the opposite end of the shaft to engage the adjustable element 22 of the tunable circuit.

The theory and operation of the apparatus shown in Fig. 1 is as follows: a test signal corresponding to the frequency to which the transformer coil unit is to be aligned is supplied from the first oscillator 35 to one terminal of the coil. The test signal appearing at the other terminal of the coil unit will vary in phase and amplitude depending upon its tuning or particular resonance condition which, of course, may differ from the frequency of the test signal. In accordance with the theory of parallel tuned circuits, when the subject coil unit is aligned or tuned to the frequency of the test signal, the amplitude of the signal appearing at the output or low potential terminal of the coil will be a minimum, and its phase will coincide with that of the applied signal. If the transformer coil is tuned to one side of the desired resonance condition, the amplitude of the output signal will increase and its phase will be displaced relative to that of the applied signal. If the transformer coil is tuned to the opposite side of the desired resonance condition, the amplitude of the output signal again will increase, but its phase will now be oppositely displaced relative to the applied signal. Thus, it is seen that the phase and amplitude of the voltage appearing at the output of the coil unit are dependent on its tuning.

In order to obtain a frequency in the audio frequency range from which the servomotor may be operated, the frequency of the 260 kilocycle test signal applied to the transformer coil unit is heterodyned down to 400 cycles by mixing the signal passing therethrough in a mixer circuit 46 with signal oscillations derived from a second or local oscillator 49 which operates at a frequency of 260 plus or minus 0.4 kilocycles. The difference frequency from the mixer will then contain the original phase and amplitude variations of the signal applied to the input of the mixer, but will be reduced in frequency to 400 cycles. The resulting signal is then amplified in audio amplifier 51 and applied to the control winding 38 of the reversible two phase motor 40. The direction and extent of rotation of the motor is controlled by the direction of the phase displacement between a pair of voltages applied to the control and reference windings thereof and is substantially independent of the amplitude of the voltages applied thereto, although the speed and torque developed by the motor will, of course, be proportional to the amplitude of the applied voltages.

The reference signal applied to the reference winding 44 of the servomotor is derived from the same oscillator source 35 as the test signal, whereby both of said signals will have the same initial phase. The frequency of the reference signal is likewise heterodyned down to the operating frequency of the servomotor by mixing the reference signal in a separate circuit path with oscillations from the local oscillator, the resulting signal then being amplified and applied to the reference winding of the motor. The mechanical output from the two-phase motor is then applied to the adjusting slug of the coil unit being aligned in such manner as to reduce the phase displacement between the test and reference signals to zero, whereby the coil unit will be substantially tuned to the desired resonance condition.

In carrying out the invention it is preferable to adjust the tuning of one coil unit of the transformer at a time so as to avoid interactive coupling effects occasioned by simultaneously tuning both coil units.

A modification of the apparatus arrangement of Figure 1 adapted for aligning radio tuner assemblies is shown in Fig. 4. In this case the test signal from source 35 is applied through a series resistor 55 connected to the high potential side of the transformer coil unit 4, 10 being aligned, the other side of the coil being connected to ground. The output voltage to be applied to the mixer 46 and amplifier 51 and thence to the control winding of the motor is taken off at the junction 58 of the resistor 55 and the high potential side of the coil, whereby the coil may be said to be connected in shunt with the control winding of the motor. Stated in other words, the transformer is so connected with respect to the first or test signal path as to develop a voltage in shunt therewith. The phase and amplitude of the voltage appearing across the coil again will vary depending on its resonance condition, but in the present case its amplitude will be greatest when the coil is tuned to the frequency of the test signal, since the high potential side of the coil is connected to the mixer 46. This is an advantage in that the greatest sensitivity is obtained in the null phase condition where it is desired. The remainder of the circuit of Fig. 4 is identical with that of Fig. 1 already described.

The size of resistor 55 will depend on the Q of the coil and should be approximately equal to the parallel impedance of the tunable circuit constituted by the branch circuit inductance 4 and parallel branch circuit capacitance 10 at resonance. In the particular arrangement employed herein the size of resistor 55 may be in the neighborhood of 20,000 ohms, for example.

It is to be understood that the above-described arrangements are illustrative of the application of the principles of the invention. Numerous other arrangements may be derived by those skilled in the art without departing from the spirit and scope of the invention.

I claim:

1. Apparatus for automatically adjusting the tuning of a tunable transformer having an adjustable tuning element tunable to a predetermined frequency, said apparatus comprising, in combination, a first source of oscillations of said predetermined frequency, a reversible two phase motor having a pair of windings in quadrature relationship, a first circuit path including said transformer connected between said source and one of said windings, said first circuit path further including frequency mixing and amplifying means, a second circuit path connected in parallel with said first circuit path between said source and the other of said windings and including frequency mixing and amplifying means substantially identical with similarly named means in said first circuit path, a second source of oscillations connected between said frequency mixing means in said circuit paths to supply oscillations thereto that differ in frequency from said predetermined frequency by the operating frequency of said motor, and means actuated by said motor for adjusting the tuning of said adjustable transformer element to said predetermined frequency in accordance with the movement of said motor.

2. The combination in accordance with claim 1 above wherein said transformer is connected to develop a voltage in series with said first circuit path.

3. The combination in accordance with claim 1 above wherein said transformer is connected to develop a voltage in shunt with said first circuit path.

4. In combination, a first source of oscillations of a predetermined frequency, a first circuit connected to said source of oscillations and including therein in relative order a tunable circuit, a first mixer, and a first amplifier; a second circuit connected to said first source of oscillations in parallel with said first circuit and including therein a second mixer and a second amplifier; a second source of oscillations of a frequency different from said first source of oscillations connected to said first and second mixers; phase sensitive translating means comprising a two-phase A. C. motor having a pair of windings in quadrature relationship directly connected for energization from respective amplifiers of respective ones of said circuits, the operating frequency of said motor being equal to the frequency difference between said first and second oscillation sources; and means operable by said translating means for adjusting the tuning of said tunable circuit to said predetermined frequency.

5. Apparatus for automatically adjusting the tuning of a tunable circuit to a prescribed frequency comprising, in combination, a source of oscillations of said prescribed frequency, a resistor connected between said source of oscillations and said tunable circuit, a servomotor having a pair of windings in quadrature relationship, one of said windings being connected to the junction of said resistor and said tunable circuit and the other of said windings being connected to said source of oscillations, and means operable by said servomotor to adjust said tunable circuit to said prescribed frequency of said source of oscillations.

6. The combination in accordance with claim 5 wherein the ohmic value of said resistance is approximately equal to the impedance of said tunable circuit at resonance.

7. Apparatus for automatically adjusting the tuning of a tunable circuit having at least one adjustable element tunable to a predetermined frequency, said apparatus comprising, in combination, a fixed source of oscillations of said predetermined frequency, phase sensitive translating means including a motor having a pair of windings in quadrature phase relationship, a first circuit connected from said source of oscillations to one of said motor windings and including said tunable circuit connected in series between said source of oscillations and said one winding, a second circuit connected in parallel with said first circuit from said source of oscillations to the other of said motor windings whereby the signals through said first and said second circuits have the same initial phase, and means operable by said motor to adjust said adjustable circuit element to said predetermined frequency of said source of oscillations and maintain substantially zero phase displacement between said signals.

References Cited in the file of this patent

UNITED STATES PATENTS

| | | |
|---|---|---|
| 2,203,878 | Rosenberg | June 11, 1940 |
| 2,379,689 | Crosby | July 3, 1945 |
| 2,393,400 | Noviks et al. | Jan. 22, 1946 |
| 2,468,350 | Sustein | Apr. 26, 1949 |
| 2,565,876 | Nicholson | Aug. 28, 1951 |
| 2,584,004 | Enslein | Jan. 29, 1952 |
| 2,585,640 | Everitt | Feb. 12, 1952 |